United States Patent
Shiau

(10) Patent No.: US 6,430,079 B1
(45) Date of Patent: Aug. 6, 2002

(54) FLAT MEMORY CELL READ ONLY MEMORY

(75) Inventor: Jiann-Ming Shiau, Nantou (TW)

(73) Assignee: Megawin Technology Co., Ltd., Hsinchu (TW)

(*) Notice: Subject to any disclaimer, the term of this patent is extended or adjusted under 35 U.S.C. 154(b) by 0 days.

(21) Appl. No.: 09/919,819

(22) Filed: Aug. 2, 2001

(51) Int. Cl.⁷ ............................................. G11C 17/00
(52) U.S. Cl. ............ 365/104; 365/230.03; 365/230.04; 257/390
(58) Field of Search ................ 365/104, 230.03, 365/230.04; 257/390

(56) References Cited

U.S. PATENT DOCUMENTS

| | | | | |
|---|---|---|---|---|
| 5,117,389 A | * | 5/1992 | Yiu | 365/184 |
| 5,760,452 A | * | 6/1998 | Terada | 257/386 |
| 6,048,767 A | * | 4/2000 | Terada | 438/262 |
| 6,084,794 A | * | 7/2000 | Lu et al. | 257/390 |

* cited by examiner

Primary Examiner—Richard Elms
Assistant Examiner—Tuan T. Nguyen
(74) Attorney, Agent, or Firm—Rosenberg, Klein & Lee

(57) ABSTRACT

A flat memory cell read only memory is disclosed. A flat cell ROM array is formed on a substrate. This array is formed by a plurality of sub-arrays. In each sub-array, a plurality of first buried diffusion regions are planted into the substrate. A insulating layer covers on the substrate. A plurality of wordlines and metal bitlines are formed on the insulating layer. The wordlines are vertically buried to the diffusion region. A flat FET array is installed in a section between the lower sides of two adjacent buried diffusion regions and word lines. Four block selecting lines are used to control the selection of the memory cell selecting transistors for reading a selecting memory cell. Commonly used metal bitlines and transistors of a minimum number are used to read data. Therefore, it has the advantages of rapidly reading, small size, high density and lower power consumption.

6 Claims, 4 Drawing Sheets

FLAT MEMORY CELL READ ONLY MEMORY

FIELD OF THE INVENTION

The present invention relates to a read only memory, and especially to flat memory cell read only memory for reading data quickly.

BACKGROUND OF THE INVENTION

Currently, in designing integrated circuit (IC), speed, size, power, cost and manufacturing process are main considerations. Most of IC designs require to reduce power supply and size, and have a preferred speed. In prior art, there are several read only memories for reading memory cell data are developed. One is a flat memory cell read only memory.

In a flat memory cell field effect transistor, at first, since the width of the polysilicon wordline determines the channel width of the field effect transistor instead of the length of the channel so that a polysilicon wordline is formed by the concept of the extremity of the manufacturing process. Furthermore, since the central section of the ROM has no field oxide layer formed by heating growth, and thus there is no defect of the channel reduction due to bird's beak effect. Therefore, flat memory cell read only memory has a dense memory cell array. Other than the size of the memory cells, the size of the ROM array is affected by the circuit of the ROM memory cells and the peripheral circuits.

Therefore, for ROM, an optimum method is to confine the number of transistors for reading the ROM and properly using the surface area of a semiconductor, thereby providing small size and easy manufacturing semiconductor elements. Comparing with other designing ways, the use of flat memory cause that each ROM has a very small area.

The prior art flat memory cell read only memory, such as U. S. Pat. No. 5, 117,389, "Flat Memory Cell Read Only Memory Integrated Circuit", in that selecting transistors of block selecting word lines $BWL_N$, selecting transistors of polysilicon wordlins $SWL_N$, selecting transistors of left side selecting lines $SBL_N$, and selecting transistors of right side selecting lines $SBR_N$ are required to read data of ROM memory cells. In the design, at least four transistors are required to read data of the ROM memory cells. Therefore, the operation time is long and speed is low. There are many transistors required for reading data of the memory cells. This will affect the size of the memory array, while other generated peripheral circuits will also affect the size of the whole array. These are defects of the U. S. patent.

SUMMARY OF THE INVENTION

Accordingly, the primary object of the present invention is to provide a flat memory cell read only memory, wherein commonly used metal bitlines and transistors of a minimum number are used to read data. Therefore, it has the advantages of rapidly reading, small size, high density and lower power consumption.

Another object of the present invention is to provide a flat memory cell read only memory, wherein straight metal lines are used to read data of metal bitlines so as to have a high density layout and has a dense memory cell array.

To achieve the object, the flat memory cell read only memory of the present invention includes a plurality of sub-arrays. Each sub-array utilizes a plurality of diffusion area, insulating layers, memory cell selecting transistors, for a plurality of metal bitlines, polysilicon word lines, memory cells, and four block selecting lines for reading data on the memory cell.

The various objects and advantages of the present invention will be more readily understood from the following detailed description when read in conjunction with the appended drawing.

DETAILED DESCRIPTION OF THE INVENTION

Figure 1:
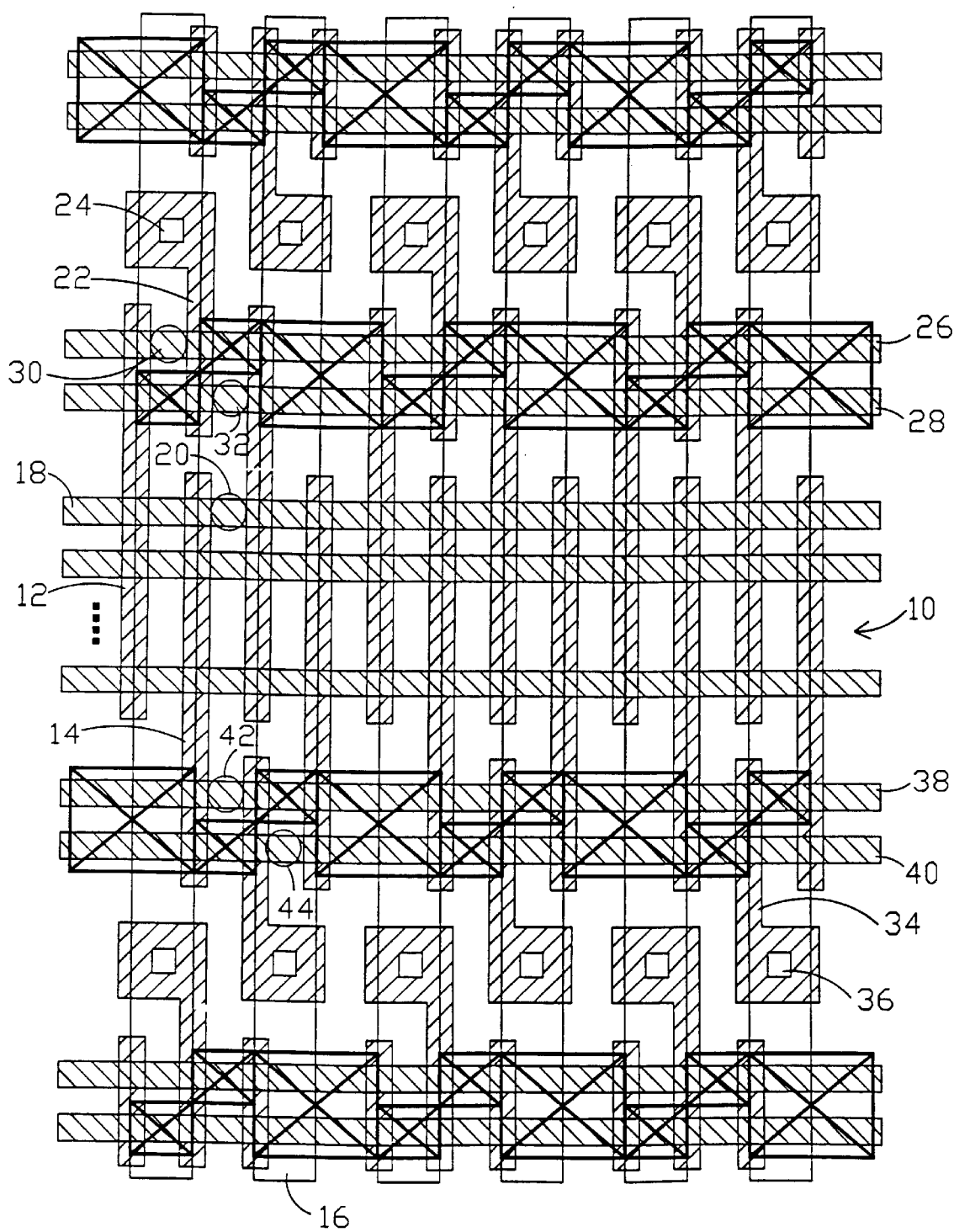
FIG. 1 shows the circuit layout of the ROM array of the present invention.

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims. In the present invention, a first buried diffusion region 10 is used to achieve a high density ROM array. Referring to FIG. 1, in the present invention, a flat cell ROM array is formed on a substrate. This array is formed by a plurality of sub-arrays. In each sub-array, a plurality of first buried diffusion regions 10 are planted into the substrate. Part of the buried diffusion bitline in the substrate is formed with even diffusion lines 12 and odd diffusion lines 14. The substrate is formed with an insulating layer (not shown) of thin oxide. Then, a plurality of polysilicon word lines 18 and a plurality of metal bitlines 16 are installed on the insulating layer so as to be formed with a field effect transistor. The polysilicon wordline 18 cuts off the first buried diffusion region 10. A plurality of memory cells are arranged at two adjacent first buried diffusion regions 10 and below the polysilicon word lines 18.

Further, a plurality of second buried diffusion regions 22 are formed on the substrate so that the second buried diffusion regions 22 are spaced with respect to the odd diffusion lines 14. The second buried diffusion regions 22 are connected to the metal bitlines 16 through contact windows 24. A first memory cell selecting line pair is formed on the insulating layer, which includes first block selecting lines 26 and second block selecting lines 28. The two cut off the even diffusion line 12 and second buried diffusion region 22 so that between two adjacent even diffusion lines 12 and adjacent second buried diffusion regions 22 and the region below the first block selecting line 26 and second block selecting line 28 are formed with memory cell selecting transistors 30 and 32 so that the gates of the memory cell selecting transistors 30 and 32 are alternatively coupled to the first block selecting line 26 and second block selecting line 28. On the substrate at positions with respect to the second buried diffusion region 22 are installed with a plurality of third buried diffusion regions 34. The third buried diffusion regions 34 are spaced to be correspondent to the even diffusion lines 12. The third buried diffusion regions 34 are connected to the metal bitlines 16 through the contact windows 36. A second memory cell selecting line pair is installed on the insulating layer, which includes third block selecting lines 38 and fourth block selecting lines 40. The two cut off the odd diffusion lines 14 and third buried diffusion regions 34 so that between two adjacent odd diffusion lines 14 and adjacent third buried diffusion regions 34 and the region below the third block selecting line 38 and fourth block selecting line 40 are formed with memory cell selecting transistors 42 and 44 so that the gates of the memory cell selecting transistors 42 and 44 are alternatively coupled to the third block selecting line 38 and fourth block selecting line 40.

Figure 2:
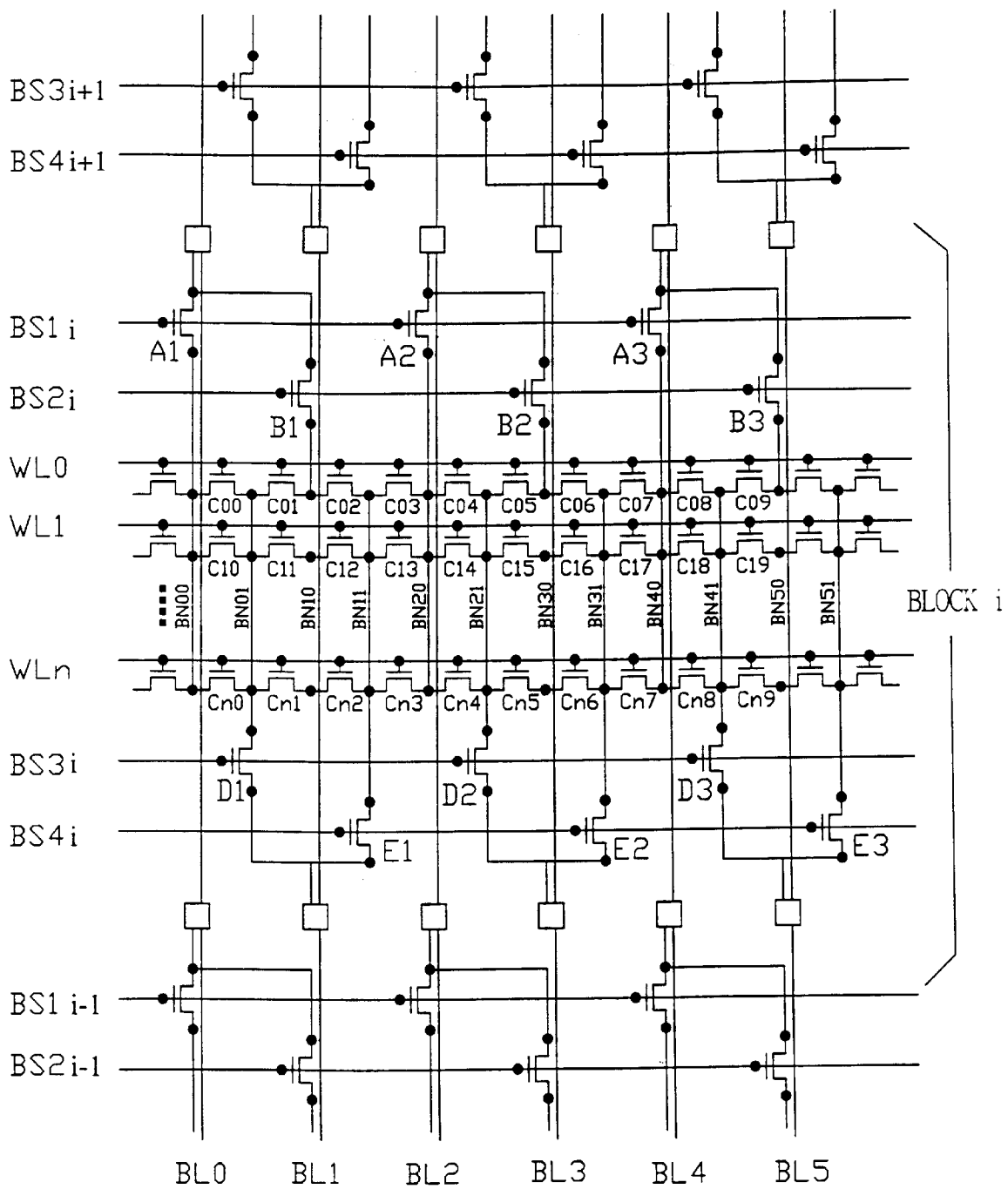
FIG. 2 is a circuit schematic view of the ROM array of the present invention.

FIG. 2 is a schematic view of the circuit of the ROM array of FIG. 1. As shown in the figures, this ROM array includes a plurality of sub-array block (i−1, i, i+1) where i represents the number of the sub-array in a ROM array circuit. $i^{th}$ block of the ROM array includes a plurality of memory cell selecting transistors. A block selecting line (BS) for selecting a proper transistor for reading, such as a first block selecting line ($BS1_i$) for reading memory cell selecting transistors A1, A2, and A3; a second block selecting line ($BS2_i$) for reading memory cell selecting transistors B1, B2, and B3; a third block selecting line $BS3_i$) for reading memory cell selecting transistors D1, D2, and D3; a fourth block selecting line ($BS3_i$) for reading memory cell selecting transistors E1, E2, and E3 are used. The drain of each memory cell selecting transistor is electrically connected to a metal—diffusion contact window. For example, the memory cell selecting transistors A1 , A2, A3 are connected to the metal bitlines BL0, BL2, BL4. The source of each memory cell selecting transistor is connected to the buried diffusion bitlines (BN). For example, each source is connected to the buried diffusion bitline (BN). For example, the sources of the memory cell selecting transistors A1, A2 and A3 are connected to the buried diffusion bit lines BN00, BN20, BN40. Odd buried diffusion bitlines (BN01, BN11, BN21, BN31 . . . ) are electrically coupled to the memory cell selecting transistors D1, E1, D2, E2, D3, E3 . . . The sub-array includes a plurality of buried diffusion bitlines BN00, BN01, BN10, BN11, BN20, BN21, . . . which are connected to the memory cell selecting transistors and are installed with a plurality of polysilicon word lines WL0~WLn vertical to the buried diffusion bitlines for defining ROM array so that the buried diffusion bitlines as sources of the first ROM memory cells C00, C01, C02, C03 . . . and drains of second ROM memory cells C10, C11, C12, C13 . . . Each of memory cell selecting transistors A1, A2, and A3 are connected to the second block selecting lines $BS1_{i-1}$, $BS1_i$, $BS1_{i-1}$ of the metal—diffusion contact windows. The others are structured similarly.

The even buried diffusion bitlines BN00, BN10, BN20, BN30, . . . are connected to the whole metal datalines by the metal—diffusion contact window through the memory cell selecting transistors A1, B1, A2, B2 . . . The odd buried diffusion bitlines BN01, BN11, BN21, BN31, are connected to the whole metal datalines by the metal—diffusion contact window through the memory cell selecting transistors C1, D1, C2, D2 . . . The middle—positioned C00, C01, . . . , C10, C11, . . . ~Cn0 . . . and other regions are used as gates/channel regions of flat memory cell transistors for storing data, thereby, forming the storage units of the ROM memory cells.

Figure 3:
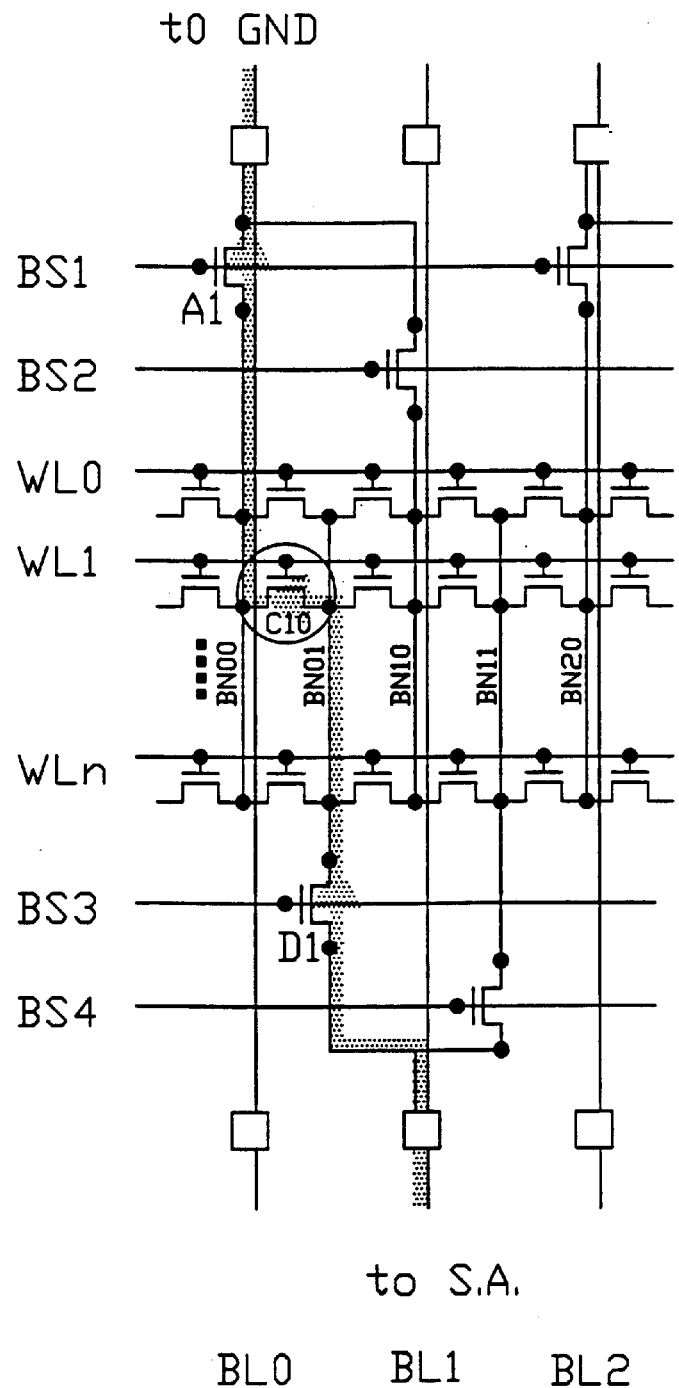
FIG. 3 is a circuit schematic view of the memory cells C10 of the present invention.

The operation of the flat memory cell ROM of the present invention will be described hereinbelow. Referring to FIG. 2, the ROM is used in data reading. One of the BS1 and BS2 is matched to one of the BS3 and BS4. One of the memory cell signals of the two memories between two adjacent bitlines is selected. With reference to FIG. 3, a schematic view for reading a memory cell C10 is illustrated. At first, the selected bitlines at two sides of the memory cell C10 are connected to a ground (GND) and SA, i.e., BL0 is grounded, and BL1 is connected to SA. Besides, the same high voltage is applied to the BS1, BS3 and WL1 for opening related transistors A1 and D1 and memory cell C10. The BS2 and BS4 and word lines unselected are set with a low signal, thereby, the current from SA flowing through the memory cell selecting transistor D1, memory cell C10 and memory cell selecting transistor A1 to the ground end GND so as to achieve the object of reading data in memory cell C10.

Figure 4:
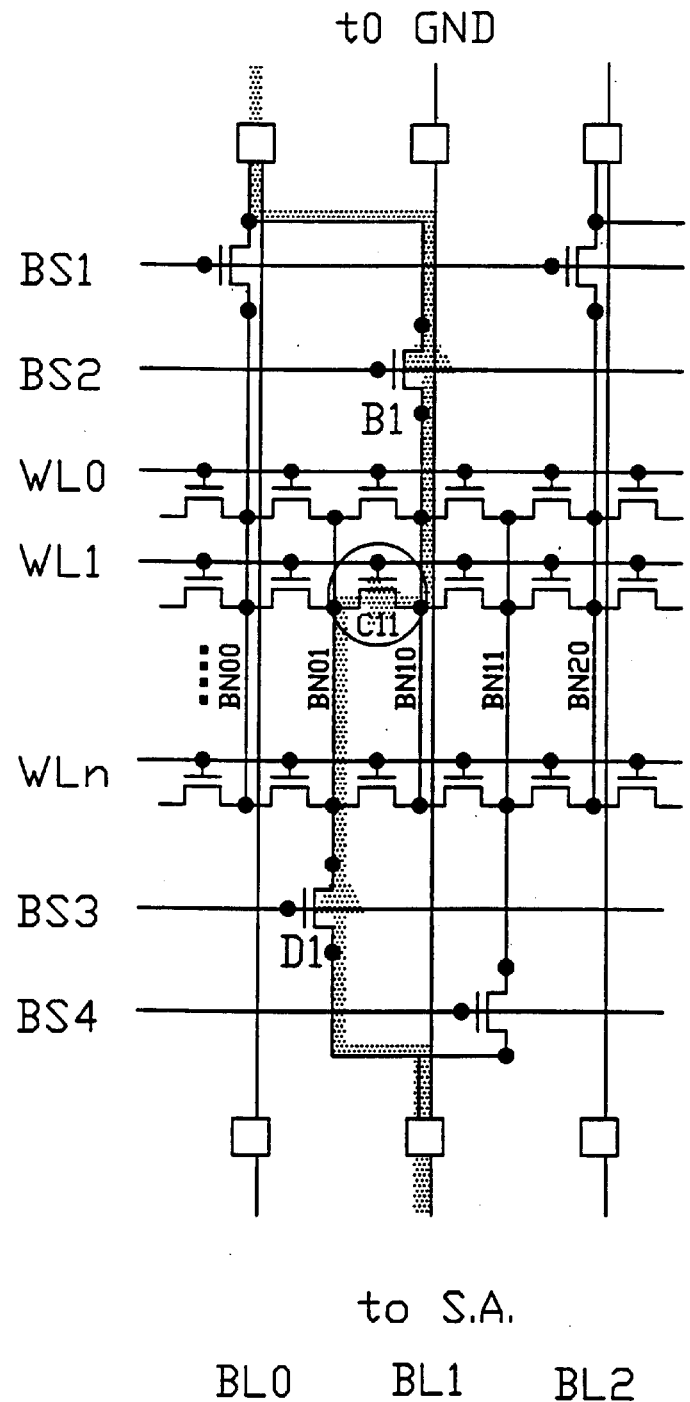
FIG. 4 is a circuit schematic view of the memory cells C11 of the present invention.

When reading data in memory cell C11, referring to FIG. 4, the bitlines at two sides of the memory cell C10 are connected to GND and SA, namely, BL1 is grounded and BL1 is connected to SA. Then, the same high voltage is applied to BS2, BS3 and WL1 for opening related transistors B1, D1 and C11. The other unselected BS1, BS4 and word lines are set with a low signal. Thereby the object of reading data in the memory cell C11 is achieved. The reading way and principle of other memory cells are identical to above two embodiments, and thus the details will not be described herein.

Since in the present invention, the insulating layer is utilized so that the metal lines of the whole ROM may be formed with a straight line without needing to consider other factors. The whole metal bitlines BL and polysilicon word lines WL are deposited on the substrate with a straight line shape. Each metal bitline are commonly used by two adjacent buried diffusion bitlines. Therefore, a high density is achieved and the memory cell array is very dense. Furthermore, in the present invention, only three transistors are used in reading data, therefore, the reading speed, size and power consumption of ROM can achieve an optimum effect.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A flat memory cell read only memory comprising a plurality of sub-arrays; each sub-array comprising:

a plurality of first buried diffusion regions planted into the substrate; part of the first buried diffusion region in the substrate being formed with even diffusion lines and odd diffusion lines;

a plurality of conductive bitlines covering on the insulating layer and being electrically connected to the diffusion regions through a plurality of contact windows;

a plurality of word lines covering on the insulating layer, and cutting out the first buried diffusion region;

a plurality of memory cells installed between different first buried diffusion regions and below the word lines for forming a memory cell array;

a plurality of second buried diffusion regions being in the substrate so that the second buried diffusion regions space respective odd diffusion lines; the second, buried diffusion region being connected to the conductive bitlines through a plurality of contact windows;

a first memory cell selecting line pair covering on the insulating layer; the first memory cell selecting line pair cutting the even diffusion lines and the second buried diffusion regions so as to be formed with a memory cell selecting transistor between two adjacent even diffusion lines and adjacent second buried diffusion regions and a section below one of the first memory cell selecting pairs;

a plurality of third buried diffusion regions being in the substrate so that the third buried diffusion regions space the respective even diffusion lines; and the third buried diffusion regions are connected to the conductive bitlines through a further plurality of contact windows; and a second memory cell selecting line pair covering on the insulating layer; the second memory cell selecting line pair cutting the odd diffusion lines and third buried diffusion regions so as to be formed with a memory cell selecting transistor between two adjacent odd diffusion lines and adjacent second buried diffusion regions and a section below one of the second memory cell selecting pairs.

2. The flat memory cell read only memory as claimed in claim 1, wherein the insulating layer is a thin oxide layer.

3. The flat memory cell read only memory as claimed in claim 1, wherein the wordline is a polysilicon wordline.

4. The flat memory cell read only memory as claimed in claim 1, wherein the conductive wordline is a metal bitline.

5. The flat memory cell read only memory as claimed in claim 1, wherein the first memory cell selecting line pair includes a first block selecting line and a second block selecting line; and the gates of the memory cell selecting transistors are sequentially coupled to the first block selecting line and the second block selecting line.

6. The flat memory cell read only memory as claimed in claim 1, wherein the second memory cell selecting line pair includes a third block selecting line and a fourth block selecting line; and the gates of the memory cell selecting transistors are sequentially coupled to the third block selecting line and the fourth block selecting line.

\* \* \* \* \*